(12) United States Patent
Baret

(10) Patent No.: US 9,467,114 B2
(45) Date of Patent: Oct. 11, 2016

(54) IMPEDANCE-MATCHING DEVICE

(71) Applicants: Commissariat àl'énergie atomique et au énergies alternatives, Paris (FR); Philippe Alonso, Pessac (FR)

(72) Inventor: Claude Baret, Pessac (FR)

(73) Assignees: COMMISSARIAT A L'ENERGIE ATOMIQUE ET AUX ENERGIES ALTERNATIVES, Paris (FR); Phillippe Alonso, Pessac (FR)

( * ) Notice: Subject to any disclaimer, the term of this patent is extended or adjusted under 35 U.S.C. 154(b) by 0 days.

(21) Appl. No.: 14/413,332

(22) PCT Filed: Jul. 11, 2013

(86) PCT No.: PCT/EP2013/064654
§ 371 (c)(1),
(2) Date: Jan. 7, 2015

(87) PCT Pub. No.: WO2014/009453
PCT Pub. Date: Jan. 16, 2014

(65) Prior Publication Data
US 2015/0155847 A1 Jun. 4, 2015

(30) Foreign Application Priority Data

Jul. 12, 2012 (FR) .................................. 12 56730

(51) Int. Cl.
*H03H 7/38* (2006.01)
*H01P 5/02* (2006.01)
(52) U.S. Cl.
CPC . *H03H 7/38* (2013.01); *H01P 5/02* (2013.01)
(58) Field of Classification Search
CPC ............ H03H 7/38; H01P 5/02; H01P 5/028

USPC .............................................. 333/33
See application file for complete search history.

(56) References Cited

U.S. PATENT DOCUMENTS

| 3,505,619 | A  | * | 4/1970 | Bishop .................... H01P 1/227 333/238 |
| 6,049,726 | A  | * | 4/2000 | Gruenwald ......... H01P 1/20363 333/205 |
| 6,292,073 | B1 |   | 9/2001 | Egolf |
| 2004/0051620 | A1 | | 3/2004 | Tung |
| 2008/0258848 | A1 | | 10/2008 | Quan |
| 2014/0224030 | A1 | | 8/2014 | Hubert |

FOREIGN PATENT DOCUMENTS

| JP | 02-243001 A | 9/1990 |
| WO | 2012/070787 A2 | 5/2012 |

OTHER PUBLICATIONS

Search Report issued in French Patent Application No. FR 12 56730 dated May 13, 2013.
International Search Report issued in Application No. PCT/EP2013/064654 dated Oct. 29, 2013.
Written Opinion issued in Application No. PCT/EP2013/064654 dated Oct. 29, 2013.

* cited by examiner

*Primary Examiner* — Stephen E Jones
*Assistant Examiner* — Scott S Outten
(74) *Attorney, Agent, or Firm* — Pearne & Gordon LLP

(57) ABSTRACT

The invention relates to an impedance-matching device comprising a circuit consisting of a plane substrate (27) whereon at least one conductive stripline (26) is arranged, at least one conductive spring (22) applying mechanical stress on the circuit.

12 Claims, 3 Drawing Sheets

IMPEDANCE-MATCHING DEVICE

FIELD OF THE INVENTION

The invention relates to an impedance-matching device.

STATE OF THE RELATED ART

The field of the invention is the hyperfrequency field particularly comprising that of photoconductor systems.

In current applications, a large number of encapsulated photodetectors to be integrated are found. To retrieve the electrical signal, there are essentially two types of connections to match the output of the component with the electrical connections: coaxial lines or microstrip lines. In the majority of cases, manufacturers use one of these two solutions.

The matching systems known to date are fixed and not suitable for optimisation. The performances thereof are dependent on the type of line chosen, the soldering quality and the properties of the usable components (photoconductors, property of line substrate and materials, etc.). In versions using metal housings, the shielding function is provided but is not suitable for optimising the performances in terms of impedance matching.

The aim of the invention is that of optimising the performances of an impedance-matching device comprising for example a microstrip circuit surrounded by a metal casing. This circuit may be charged by a photoconductor from which the electrical response is to be retrieved.

The aim of the invention is that of producing a robust device, wherein the performances in terms of impedance matching are optimised in a relatively wide frequency band (greater than one GHz). The invention meets strict requirements: indeed, the signals transmitted must not be subject to degradations in the useful band.

DESCRIPTION OF THE INVENTION

The invention relates to an impedance-matching device comprising a circuit consisting of a plane substrate whereon at least one conductive line and a ground plane are arranged, characterised in that this ground plane is positioned directly on an inner wall of the conductive housing and in that this device comprises at least one conductive spring, having at least one variable feature, arranged on the line side and applying mechanical stress on the circuit using a setting screw to compress the ground plane against said inner wall.

Advantageously, the circuit may be a microstrip line, a "slotline". It may comprise coplanar lines ("planar waveguides") or "striplines".

Advantageously, the springs may be arranged symmetrically in relation to the conductive lines.

Advantageously, each spring has at least one variable feature, for example the number of turns exceeding a ground plane, the gap between turns, or the length of a central core. Each spring may have a screw for setting the size of the spring, or a central core in the shape of a screw wherein the tightening determines the length inside the spring.

DETAILED DESCRIPTION OF PARTICULAR EMBODIMENTS

Figure 1A:
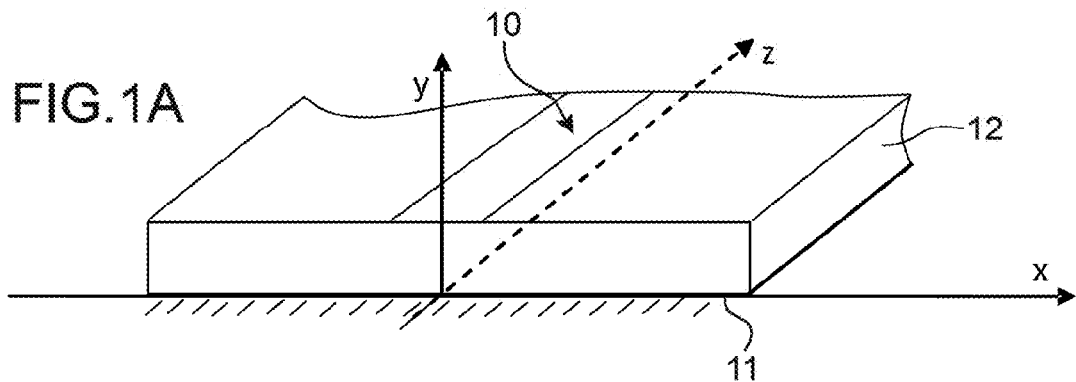
FIGS. 1A and 1B illustrate a microstrip line in a perspective and cross-sectional view, respectively.
Figure 1B:
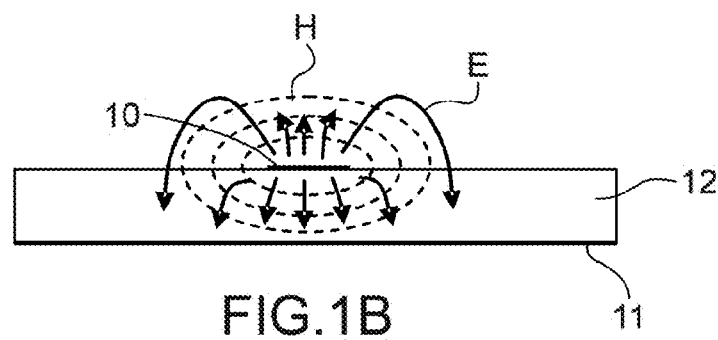

Microstrip lines are an extension of microwave technology to printed circuits. They offer numerous advantages, particularly the small size thereof, the light weight thereof and the ease of integration thereof in a housing. In return, they cannot transmit noteworthy power and can only radiate locally. Microstrip lines are used extensively in the manufacture of hyperfrequency circuits. In this type of line, as illustrated in FIGS. 1A and 1B, the lines of electric E and magnetic fields H are above all concentrated in the dielectric of the substrate 12 between the metallised line 10 and the ground plane 11, although a small portion is also found in the air above the substrate. Strictly speaking, the exact fields of a microstrip structure correspond to a TM-TE wave. In practice, the fields are quasi-TEM since the dielectric thickness is very small in relation to the wavelength. It is noted that TE represents a Transverse Electric mode, TM represents a Transverse Magnetic mode and TEM represents a Transverse Electro-Magnetic mode, which is characterised by transverse components only in x and y (the components $E_z$ and $H_z$ are zero).

Figure 2:
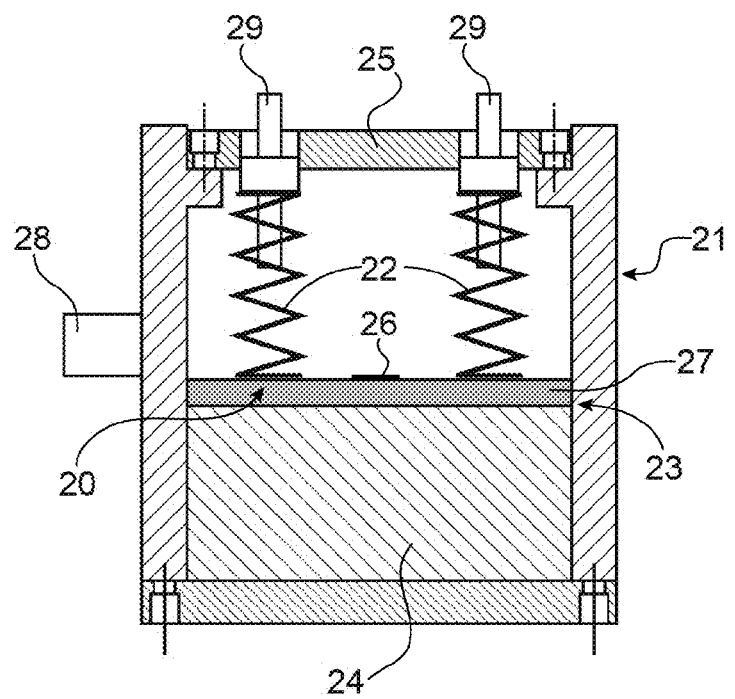
FIG. 2 illustrates the device according to the invention.

In the device according to the invention illustrated in FIG. 2, the circuit 20, in this case a "matched" microstrip line 26 arranged on a substrate 27 for example, is enclosed in a conductive housing 21 equipped with a cover 25. Then, the ground plane is positioned directly on an inner wall of the conductive housing 21 (ground plane contact 23) and mechanical stress is applied using a plurality of springs 22 distributed on the line side using setting screws 29. The reference 28 corresponds to an external power supply input (for example polarisation in the case of a photoconductor).

The springs 22 have two essential roles in the device according to the invention: they firstly make it possible to compress the ground plane 23 of the circuit 20 against the inner wall 24 of the conductive housing 21, then they induce locally inductive coupling with the microstrip line 26. In this way, the internal radiation in the vicinity of the line is in part coupled with the conductive housing 21. The compression of the springs 22 makes it possible to modify the line impedance slightly and thus makes it possible to enhance the matching of the circuit and thus the transmission in the line. To make the correct setting and thus match the circuit in the useful frequency band, a vectorial network analyser is used. The analyser port is previously calibrated at the end of connections in order to make a measurement of the S parameter in reflection. If the analyser port 3 is used, the term S33 parameter is used.

Figure 3:
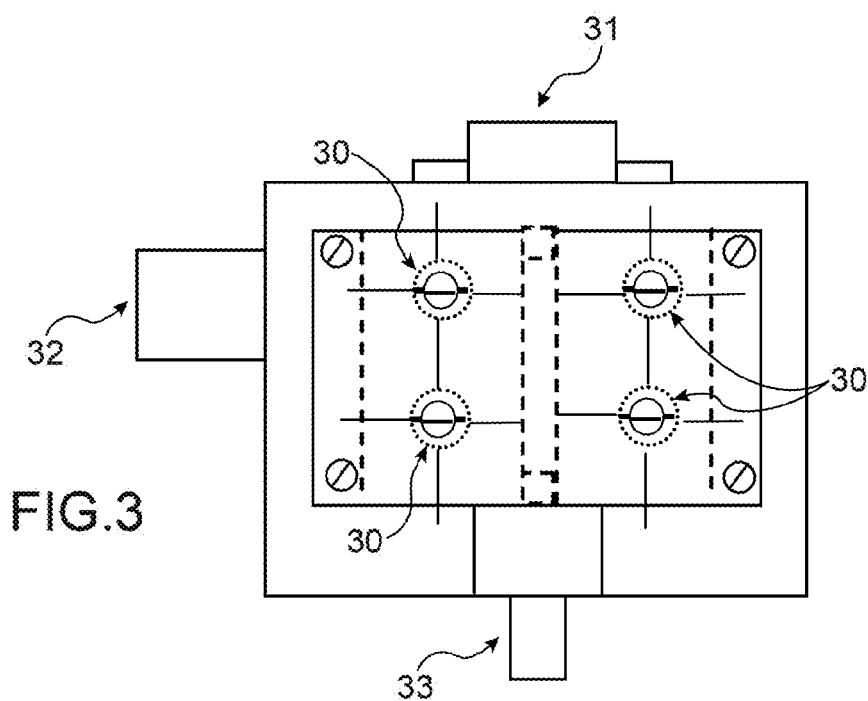
FIG. 3 illustrates an example of an embodiment of the device according to the invention.

In an example of an embodiment illustrated in FIG. 3, the setting consists of compressing the springs on the circuit using screws placed on the surface of the upper cover. In this figure, 31 corresponds to an optical input, 32 to the external power supply and 33 to an electrical output (SMA or other) and measurement of the reflection coefficient. The optimisation consists of decreasing S33 (in dB) in the frequency band defined by the device according to the invention.

Figure 4:
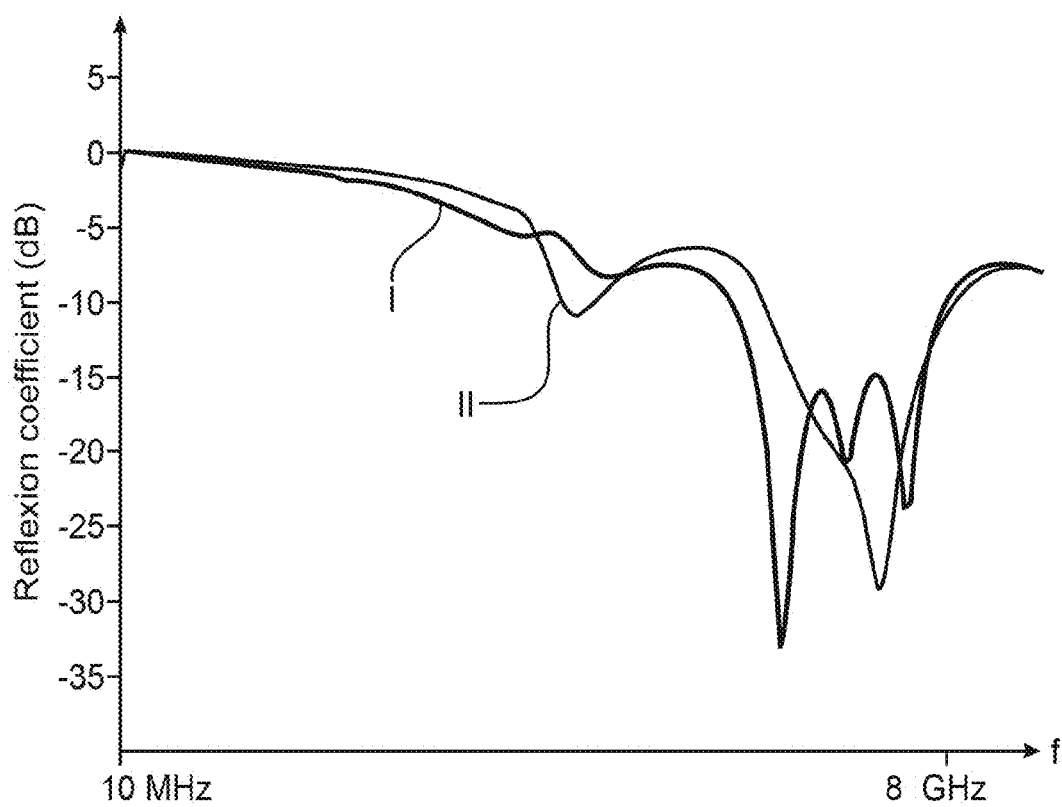
FIG. 4 illustrates the frequency responses of the reflection coefficients (Sij) in the case wherein the circuit is not equipped with springs or in the case wherein it is equipped with springs as in the microstrip circuit according to the invention.

Indeed, there is a relationship between the reflection coefficient (Sij) and the input impedance (Ze) in terms of the network analyser. The closer the circuit impedance to the normalised impedance (50Ω), the weaker the response reflected by the system. The comparison of the reflection coefficient responses, illustrated in FIG. 4, makes it possible to demonstrate the efficiency of the device according to the invention. The curve I corresponds to the device according to the invention, comprising a closed housing with springs, and the curve II to a closed housing without springs. If a threshold of −10 dB is taken as a criterion, an increase (approximately 15% in the example illustrated) of the frequency brand wherein the circuit is impedance-matched is indeed observed.

The device according to the invention offers the advantage of optimising the matched circuit and thus enhancing the performances in terms of impedance matching in the frequency band of the system. The bandwidth is essentially dependent on the intrinsic characteristics of the semiconductor and the quality of the connections. Using springs enhances the impedance matching at a photoconductor output and makes it possible to adjust this device. Indeed, the greater the extent of circuit matching, the larger the bandwidth and the greater the enhancement of the circuit transfer function. This enhancement is conveyed by a decrease in the rear rebounds and satisfactory front restitution during transients.

Figure 5:
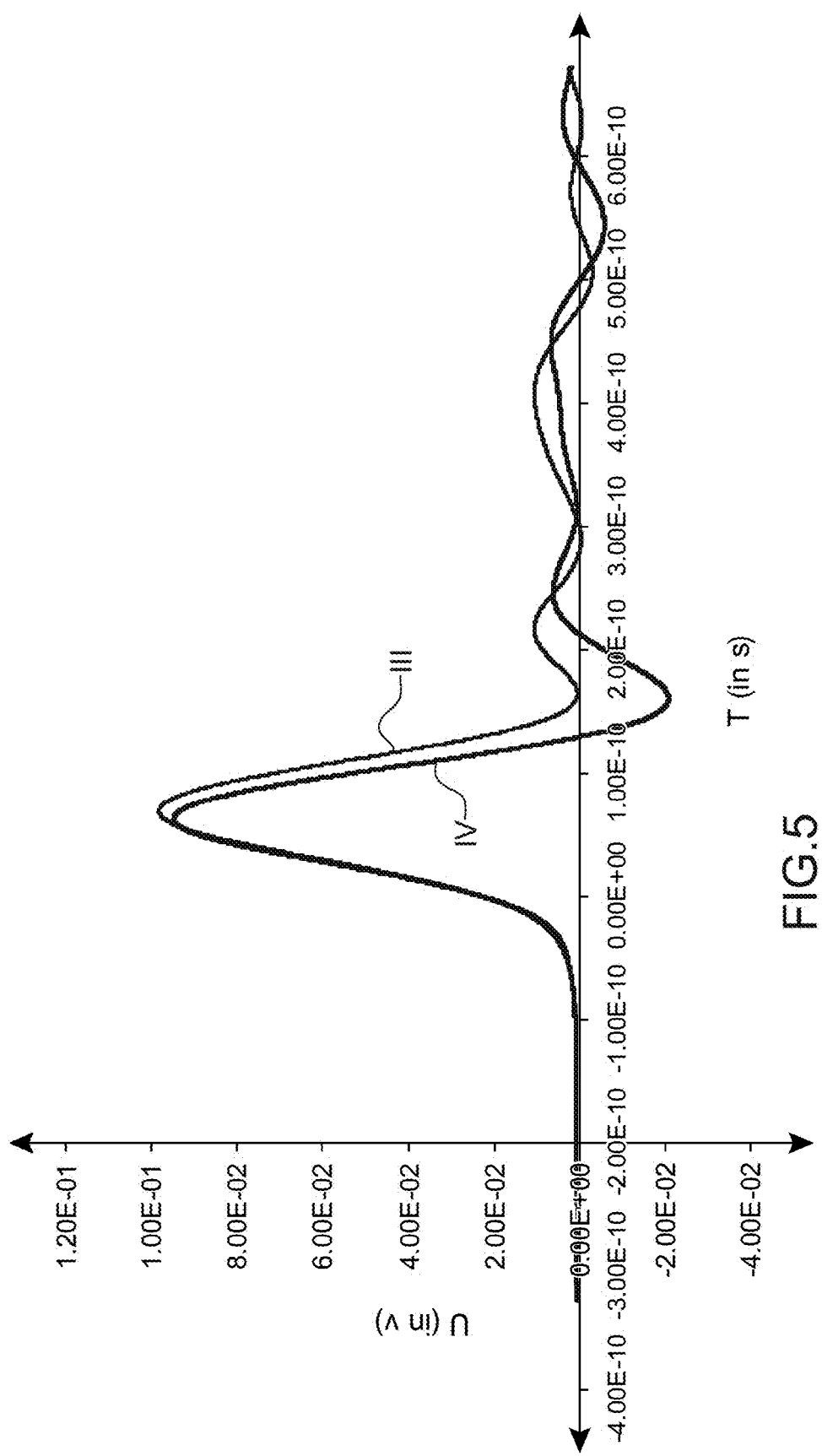
FIG. 5 represents curves illustrating the comparison of impulse responses between two operational circuits: one circuit organised according to the invention and one non-optimised circuit with no springs.

Characterising this device on the basis of an impulse response, as illustrated in FIG. 5, makes it possible to verify the circuit performances and ensure that the circuit meets expectations (performances in respect of rise time Trise, fall time Tfall, and overshoot, etc.). The curve III corresponds to the device according to the invention and the curve IV to a non-optimised device. A further strength worth noting is that the system is relatively simple to use, regardless of the photoconductor component selected at the input.

The device according to the invention makes it possible to enhance the performances of the circuits mounted in metal casings. The equidistributed contact between the ground plane of the circuit and the housing is an essential condition to ensure satisfactory electrical performances (low reflection coefficient and thus superior impedance matching in terms of the output connections). Indeed, adding conductive springs provides the compression of the circuit and thus makes it possible to have loose coupling between the field radiated by the line and the closed conductive housing.

The invention helps modify the planar circuit transfer function and thus makes it possible to reduce rebound phenomena during rapid transients.

The device according to the invention may be used for a semiconductor-based device capable of detecting radiation in the optical range and converting same into an electrical signal (Photodiode). In the optoelectronic field, this type of device is used regularly for characterising optical signals from measurement chains equipped with optical fibres. Indeed, the design of specific laser diagnostics requires the use of photodiodes wherein the performances are directly related to the components selected but also to the means implemented for matching the product output. The development and use of fibre-based devices may also use such photon-electron conversion means in a more or less harsh environment, subject to electromagnetic interference in radiated mode. The device embodied in this way is suitable for industrialisation and may be used in the field of telecommunications or research.

It is important to note that such a system may be applied more broadly in respect of hyperfrequency ranges (antennas, circuits, components, etc.). Indeed, all electronic circuits requiring adjustment to enhance the impedance matching of a system may use this type of invention.

What is claimed is:

1. Impedance-matching device comprising a circuit comprising a plane substrate whereon at least one conductive line and a ground plane are arranged, wherein the ground plane is positioned directly on an inner wall of a conductive housing, the impedance-matching device comprising a plurality of conductive springs each with a plurality of turns and having at least one variable feature, arranged on the conductive line side and applying mechanical stress directly to the substrate using a setting screw to compress the ground plane against said inner wall.

2. Device according to claim 1 wherein the at least one variable feature is the number of turns exceeding a ground plane.

3. Device according to claim 2, wherein each spring has a screw for setting the size of the spring.

4. Device according to claim 1 wherein the at least one variable feature is the gap between turns.

5. Device according to claim 4, wherein each spring has a screw for setting the size of the spring.

6. Device according to claim 1 wherein the at least one variable feature is the length of a central core.

7. Device according to claim 6, wherein each spring has a central core in the shape of a screw wherein the tightening determines the length inside the spring.

8. Device according to claim 1, wherein the circuit is a microstrip line.

9. Device according to claim 1, wherein the circuit is a slotline.

10. Device according to claim 1, wherein the circuit comprises coplanar lines.

11. Device according to claim 1, wherein the circuit comprises striplines.

12. Device according to claim 1, wherein the plurality of conductive springs are arranged symmetrically in relation to the conductive lines.

* * * * *

UNITED STATES PATENT AND TRADEMARK OFFICE
CERTIFICATE OF CORRECTION

PATENT NO. : 9,467,114 B2
APPLICATION NO. : 14/413332
DATED : October 11, 2016
INVENTOR(S) : Baret Page 1 of 1

It is certified that error appears in the above-identified patent and that said Letters Patent is hereby corrected as shown below:

On the Title Page

In the assignee item (73): Please delete "Phillippe" and replace it with -- Philippe --

Signed and Sealed this
Tenth Day of January, 2017

Michelle K. Lee
*Director of the United States Patent and Trademark Office*